(12) United States Patent
Nishisaka et al.

(10) Patent No.: US 8,759,804 B2
(45) Date of Patent: Jun. 24, 2014

(54) CHAMBER APPARATUS AND EXTREME ULTRAVIOLET LIGHT GENERATION SYSTEM

(75) Inventors: Toshihiro Nishisaka, Hiratsuka (JP); Yukio Watanabe, Hiratsuka (JP); Tamotsu Abe, Odawara (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/122,354

(22) PCT Filed: Mar. 11, 2011

(86) PCT No.: PCT/JP2011/056483
§ 371 (c)(1),
(2), (4) Date: Sep. 12, 2011

(87) PCT Pub. No.: WO2011/115233
PCT Pub. Date: Sep. 22, 2011

(65) Prior Publication Data
US 2011/0309260 A1 Dec. 22, 2011

(30) Foreign Application Priority Data

Mar. 18, 2010 (JP) .................. 2010-063359
Dec. 24, 2010 (JP) .................. 2010-288902

(51) Int. Cl.
*A61N 5/06* (2006.01)
*G01J 3/10* (2006.01)
*H05G 2/00* (2006.01)

(52) U.S. Cl.
USPC .................................. 250/504 R

(58) Field of Classification Search
USPC .................................. 250/504 R
See application file for complete search history.

(56) References Cited

U.S. PATENT DOCUMENTS

| 6,285,743 | B1 | 9/2001 | Kondo et al. |
| 6,413,268 | B1 * | 7/2002 | Hartman ..................... 607/94 |
| 8,143,606 | B2 * | 3/2012 | Komori et al. ............ 250/504 R |
| 2002/0162975 | A1 | 11/2002 | Orsini |
| 2005/0199829 | A1 * | 9/2005 | Partlo et al. ............... 250/504 R |
| 2005/0225739 | A1 | 10/2005 | Hiura |

(Continued)

FOREIGN PATENT DOCUMENTS

| EP | 1255163 B1 | 11/2002 |
| EP | 1475807 B1 | 11/2004 |

(Continued)

OTHER PUBLICATIONS

Notch, Oxford English Dictionary, <http://www.oed.com/view/Entry/128536?rskey=SBDAPT&result=1&isAdvanced=false>.*

(Continued)

*Primary Examiner* — Michael Logie
*Assistant Examiner* — Jason McCormack
(74) *Attorney, Agent, or Firm* — McDermott Will & Emery LLP

(57) ABSTRACT

A chamber apparatus used with an external apparatus having an obscuration region may include: a chamber in which extreme ultraviolet light is generated; a collector mirror provided in the chamber for collecting the extreme ultraviolet light; a support for securing the collector mirror to the chamber; and an output port provided to the chamber for allowing the extreme ultraviolet light collected by the collector mirror to be introduced therethrough into the external apparatus.

18 Claims, 17 Drawing Sheets

(56) References Cited

U.S. PATENT DOCUMENTS

| | | |
|---|---|---|
| 2005/0274912 A1* | 12/2005 | Hergenhan et al. ........ 250/504 R |
| 2006/0011870 A1 | 1/2006 | Yamamoto et al. |
| 2006/0097203 A1* | 5/2006 | Bykanov et al. .......... 250/504 R |
| 2006/0176547 A1 | 8/2006 | Sasian |
| 2006/0243927 A1 | 11/2006 | Tran et al. |
| 2007/0228298 A1* | 10/2007 | Komori et al. ............. 250/493.1 |
| 2008/0042079 A1 | 2/2008 | Singer et al. |
| 2008/0099699 A1* | 5/2008 | Yabuta et al. ............. 250/504 R |
| 2008/0104828 A1* | 5/2008 | Someya et al. ................. 29/720 |
| 2008/0179548 A1* | 7/2008 | Bykanov et al. .......... 250/504 R |
| 2009/0261277 A1* | 10/2009 | Soumagne et al. ........ 250/504 R |
| 2009/0289205 A1* | 11/2009 | Moriya et al. ............. 250/504 R |
| 2010/0019173 A1 | 1/2010 | Someya et al. |
| 2010/0032590 A1* | 2/2010 | Bykanov et al. .......... 250/504 R |
| 2010/0051831 A1* | 3/2010 | Tao et al. .................. 250/504 R |
| 2010/0078577 A1* | 4/2010 | Moriya et al. ............. 250/504 R |
| 2010/0090133 A1 | 4/2010 | Endo et al. |
| 2010/0140513 A1* | 6/2010 | Nagai et al. ............... 250/504 R |
| 2010/0171049 A1* | 7/2010 | Moriya et al. ............. 250/504 R |
| 2010/0181503 A1* | 7/2010 | Yanagida et al. ......... 250/504 R |
| 2010/0182579 A1 | 7/2010 | Loopstra et al. |
| 2010/0213395 A1* | 8/2010 | Ueno et al. ................ 250/504 R |
| 2011/0057126 A1* | 3/2011 | Hoshino et al. ........... 250/504 R |
| 2011/0240890 A1* | 10/2011 | Govindaraju et al. .... 250/504 R |

FOREIGN PATENT DOCUMENTS

| | | |
|---|---|---|
| JP | 2003-008124 A | 1/2003 |
| JP | 2007-266234 A | 10/2007 |
| WO | WO-2011/115233 A1 | 9/2011 |

OTHER PUBLICATIONS

Notch, Dictionary.com, <http://dictionary.reference.com/browse/notch?s=t&path=/>.*

International Search Report and Written Opinion issued in International Patent Application No. PCT/JP2011/056483 dated Aug. 24, 2011.

Notification Concerning Submission, Obtention or Transmittal of Priority Document issued in International Patent Application No. PCT/JP2011/056483 dated Apr. 22, 2011.

U.S. Office Action issued in U.S. Appl. No. 13/958,112 dated Feb. 14, 2014.

* cited by examiner

CHAMBER APPARATUS AND EXTREME ULTRAVIOLET LIGHT GENERATION SYSTEM

CROSS-REFERENCE TO RELATED APPLICATIONS

The present application is the U.S. National Phase under 35 U.S.C. §371 of International Application No. PCT/JP2011/056483, filed on Mar. 11, 2011, which in turn claims priority from Japanese Patent Application No. 2010-063359 filed on Mar. 18, 2010, and Japanese Patent Application No. 2010-288902 filed on Dec. 24, 2010, the disclosure of each of which is incorporated herein by reference in its entirety.

BACKGROUND

1. Technical Field

This disclosure relates to a chamber apparatus and an extreme ultraviolet light generation system.

2. Related Art

With recent increase in integration of semiconductor devices, transfer patterns for use in photolithography of a semiconductor process have rapidly become finer. In the next generation, microfabrication at 70 to 45 nm, further, microfabrication at 32 nm or less is to be demanded. Accordingly, for example, to meet the demand for microfabrication at 32 nm or less, an exposure apparatus is expected to be developed, where an extreme ultraviolet (EUV) light generation system generating EUV light of a wavelength of approximately 13 nm is combined with a reduction projection reflective optical system.

There are mainly three types of EUV light generation systems, namely, a laser produced plasma (LPP) type system using plasma produced by applying a laser beam onto a target, a discharge produced plasma (DPP) type system using plasma produced by discharge, and a synchrotron radiation type system using orbital radiation.

SUMMARY

A chamber apparatus according to one aspect of this disclosure may be used with an external apparatus having an obscuration region, and the chamber apparatus may include: a chamber in which extreme ultraviolet light is generated; a collector mirror provided in the chamber for collecting the extreme ultraviolet light; a support for securing the collector mirror to the chamber; and an output port provided to the chamber for allowing the extreme ultraviolet light collected by the collector mirror to be introduced therethrough into the external apparatus.

A chamber apparatus according to another aspect of this disclosure may be used with an external apparatus having an obscuration region, and the chamber apparatus may include: a chamber in which extreme ultraviolet light is generated; a collector mirror including a plurality of mirror members for collecting the extreme ultraviolet light, the collector mirror being provided in the chamber; a support for securing the plurality of the mirror members to the chamber such that focal points of the plurality of the mirror members coincide with each other and a space is provided between the plurality of the mirror members; and an output port provided to the chamber for allowing the extreme ultraviolet light collected by the collector mirror to be introduced into the external apparatus.

An extreme ultraviolet light generation system according to yet another aspect of this disclosure may be used with a laser apparatus, and the extreme ultraviolet light generation system may include one of the chamber apparatuses mentioned above.

These and other objects, features, aspects, and advantages of this disclosure will become apparent to those skilled in the art from the following detailed description, which, taken in conjunction with the annexed drawings, discloses preferred embodiments of this disclosure.

DESCRIPTION OF PREFERRED EMBODIMENTS

Figure 1:
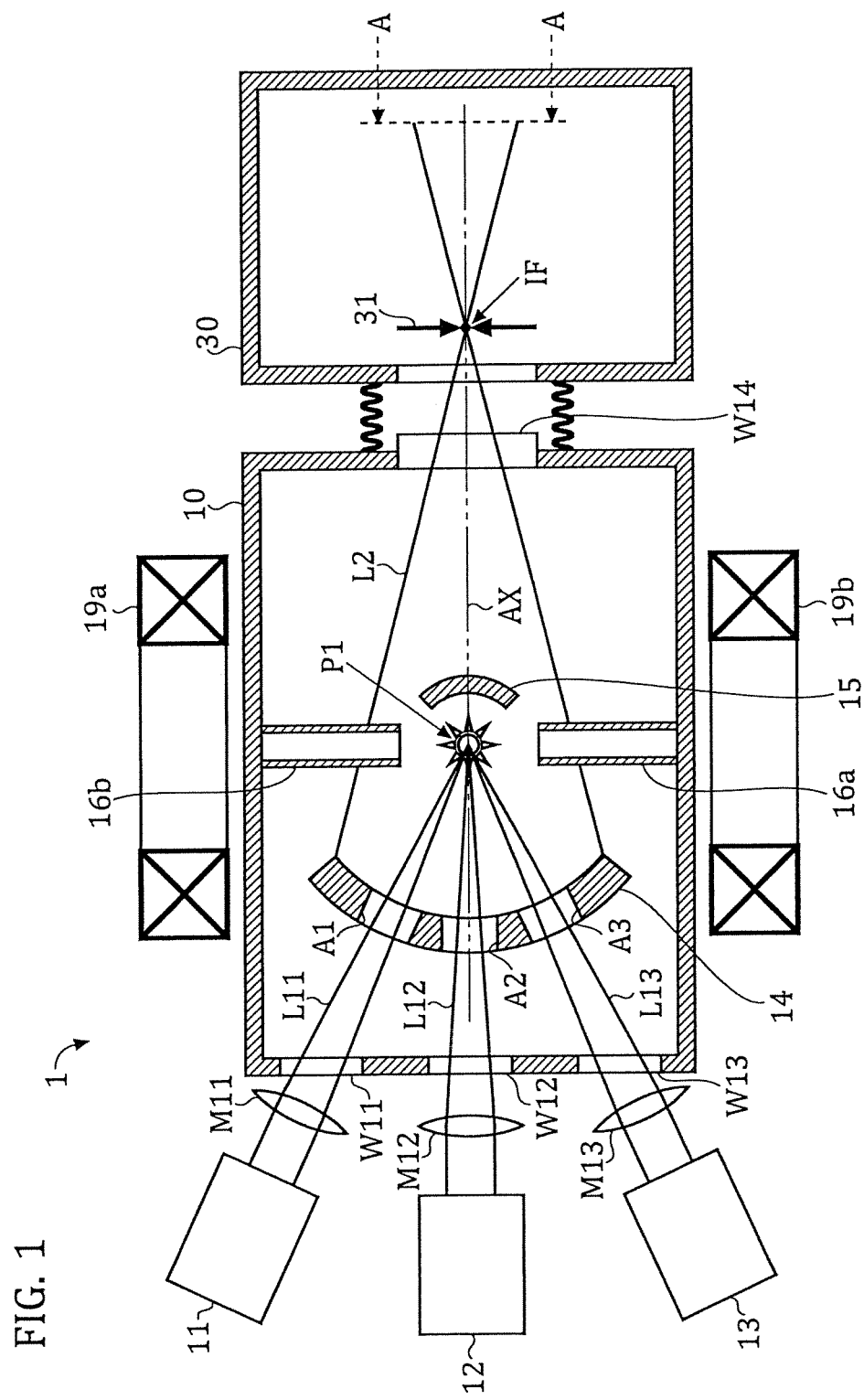
FIG. 1 is a schematic sectional view of an EUV light generation system according to a first embodiment of this disclosure, taken along a plane containing the axis of EUV light.

Selected embodiments of this disclosure will now be described in detail with reference to the accompanying drawings. The drawings referred to in the following description merely schematically show shape, size, and positional relationship of relevant elements to an extend that allows the spirit of this disclosure to be understood. Therefore, the shape, the size, and the positional relationship shown in the drawings do not limit the scope of this disclosure. In addition, part of the hatching in the sectional views is omitted in order to clearly show the configuration. Furthermore, numerical values given in the following description are only preferable examples of this disclosure and thus do not limit the scope of this disclosure.

First Embodiment

Figure 2:
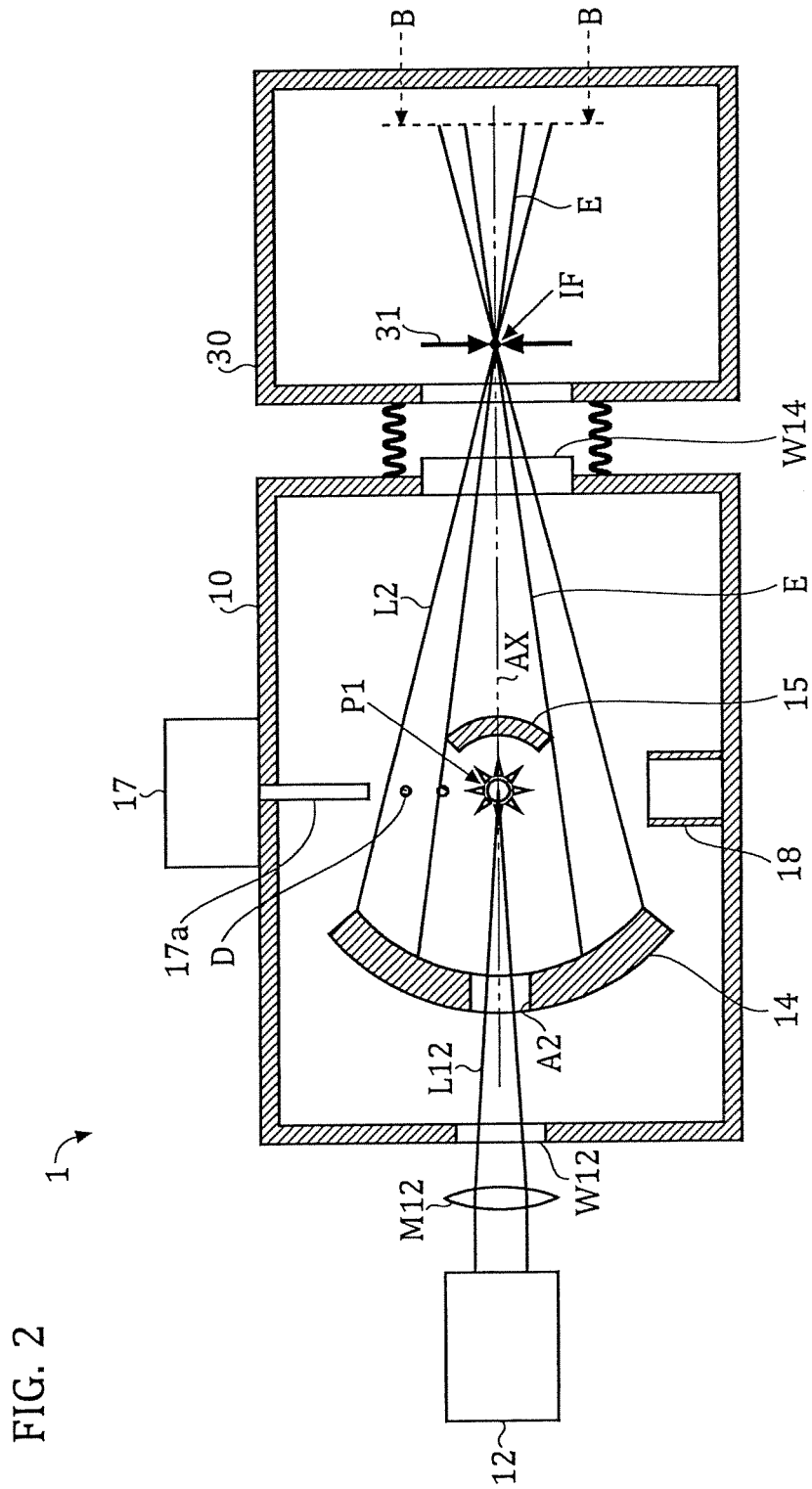
FIG. 2 is a schematic sectional view of the EUV light generation system shown in FIG. 1, taken along another plane containing the axis of the EUV light, the plane being different from that for FIG. 1.

A collector mirror and an EUV light generation system according to a first embodiment of this disclosure will now be described in detail with reference to the relevant drawings. FIG. 1 is a schematic sectional view of an EUV light generation system 1 according to the first embodiment, taken along a plane containing the axis of EUV light. FIG. 2 is a schematic sectional view of the EUV light generation system 1 shown in FIG. 1, taken along another plane containing the axis of the EUV light, the plane being different from that for FIG. 1.

Referring to FIG. 1, the EUV light generation system 1 may include: a sealed chamber 10 defining a space in which EUV light is generated; an exposure-apparatus-connection unit 30 optically connecting the chamber 10 to an exposure apparatus (not shown); and a gate valve W14 allowing airtightly the communication between the chamber 10 and the exposure-apparatus-connection unit 30.

The chamber 10 may be provided with windows W11 through W13 for introducing various laser beams into the chamber 10, and the laser beams are to be focused at a predetermined point in a plasma generation region P1 inside the chamber 10. The chamber 10 may also be provided with a beam dump 15 and an EUV collector mirror 14. The beam dump 15 may prevent a laser beam passing through the plasma generation region P1 from entering the exposure-apparatus-connection unit 30. The EUV collector mirror 14 may collect EUV light L2 emitted from plasma generated in the plasma generation region P1 and reflect the collected EUV light L2 toward the exposure-apparatus-connection unit 30. The beam dump 15 may either absorb a laser beam incident thereon or reflect a laser beam incident thereon in a direction other than the direction of incidence thereof. The EUV collector mirror 14 may have a reflective surface that is spheroidal, spherical, paraboloidal, or the like (a concave surface), and reflect the EUV light L2 emitted in the plasma generation region P1 such that the EUV light L2 is focused at a predetermined point (intermediate focus IF) inside the exposure-apparatus-connection unit 30. The EUV light L2 focused at the intermediate focus IF may form an optical image on a predetermined plane (plane A-A) inside the exposure-apparatus-connection unit 30 through a pinhole 31.

The EUV collector mirror 14 may also be provided with through-holes A1 through A3 allowing the laser beams having entered the chamber 10 through the respective windows W11 through W13 to travel therethrough and to be focused in the plasma generation region P1. For example, a main pulsed laser beam L12 outputted from a main pulse laser 12 provided outside the chamber 10 may travel through a focusing optical system, including an optical element such as a focusing lens M12, and then through the window W12 into the chamber 10. The main pulsed laser beam L12 may then further travel through the through-hole (first through-hole) A2 in the EUV collector mirror 14, and be focused in the plasma generation region P1. Likewise, a pre-pulsed laser beam L11 and an ionization laser beam L13 outputted respectively from a pre-pulse laser 11 and an ionization laser 13 provided outside the chamber 10 may travel through respective focusing optical systems, including optical elements such as focusing lenses M11 and M13 respectively, and then through the windows W11 and W13 into the chamber 10. The pre-pulsed laser beam L11 and the ionization laser beam L13 may then further travel through the respective through-holes (second through-holes) A1 and A3 in the EUV collector mirror 14, and be focused in the plasma generation region P1. That is, in the first embodiment, the axes of a plurality of laser beams (L11 through L13) are defined such that the laser beams may pass through the respective through-holes A1 through A3.

In the first embodiment, a case where a target material may be irradiated with laser beams (the pre-pulsed laser beam L11 and the main pulsed laser beam L12) in a plurality of steps to thereby be turned into plasma will be shown as an example. This disclosure, however, is not limited thereto. The target material may be irradiated with a single pulsed laser beam to thereby be turned into plasma. Further, in the first embodiment, in order to efficiently collect target material debris into debris collection units 16a and 16b, the debris may be irradiated with the ionization laser beam L13 to thereby be ionized, whereby neutral debris may be ionized. Thus, more debris may be trapped into a magnetic field and be collected.

The chamber 10 may further include a pair of electromagnetic coils 19a and 19b and the debris collection units 16a and 16b. The electromagnetic coils 19a and 19b may generate a magnetic field, into which charged particles (hereinafter referred to as debris), such as ions generated in the plasma generation region P1 may be trapped. The debris trapped in the magnetic field generated by the electromagnetic coils 19a and 19b may be collected into the debris collection units 16a and 16b. The electromagnetic coils 19a and 19b may be disposed such that the central magnetic line of force of the magnetic field generated thereby passes through the plasma generation region P1. The debris generated in the plasma generation region P1 may travel away from the plasma generation region P1 while being trapped in the magnetic field. The debris collection units 16a and 16b may be provided at positions toward which the debris may travel. With this, the debris traveling while being trapped in the magnetic field may be collected into the debris collection units 16a and 16b. One end of each of the debris collection units 16a and 16b may be positioned in an obscuration region E, which will be described later.

Referring to FIG. 2, the EUV light generation system 1 may further include a droplet generator 17 provided with a nozzle 17a and a target collection unit 18. The target material, such as tin (Sn), serving as a source material for generating EUV light may be stored in a molten state inside the droplet generator 17, and the molten Sn stored inside the droplet generator 17 may be outputted as a liquid droplet D through the nozzle 17a toward the plasma generation region P1 inside the chamber 10. A droplet D having passed through the plasma generation region P1 may be collected into the target collection unit 18. The target material may be supplied to the plasma generation region P1 regularly or on-demand, and the droplets D having passed through the plasma generation region P1 or residual droplets which have not been turned into plasma may be collected into the target collection unit 18. The droplet generator 17 provided with the nozzle 17a may function as a target supply unit for supplying the droplets D of the target material to the plasma generation region P1 in the chamber 10.

Figure 3:
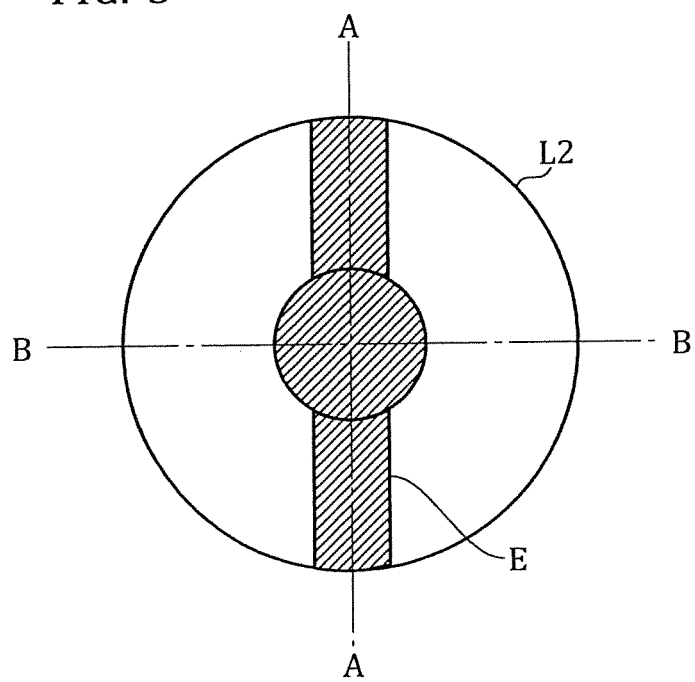
FIG. 3 schematically shows a far field pattern of the EUV light formed on plane A-A shown in FIG. 1.

Now, a far field pattern of the EUV light L2 formed on plane A-A inside the exposure-apparatus-connection unit 30 will be described in detail with reference to the relevant drawings. FIG. 3 schematically shows the far field pattern of the EUV light L2 formed on plane A-A shown in FIG. 1. As shown in FIG. 3, the far field pattern of the EUV light L2 may include an obscuration region E. The obscuration region E refers to a region corresponding to an angle range within which the EUV light L2 collected by the EUV collector mirror 14 may not be used in the exposure apparatus. Hence, even when members such as optical elements are provided in the obscuration region E or the reflective surface of the EUV collector mirror 14 is deformed in a portion thereof corresponding to the obscuration region E, the exposure process performed in the exposure apparatus may not be affected.

Thus, in the first embodiment, measuring devices or through-holes for allowing the passage of the laser beams may be provided in the portion corresponding to the obscuration region E on the EUV collector mirror 14. In the example described above, the through-holes A1 and A3 allowing the passage of the pre-pulsed laser beam L11 and the ionization laser beam L13, respectively, have been provided in the portion corresponding to the obscuration region E on the EUV collector mirror 14.

Figure 4:
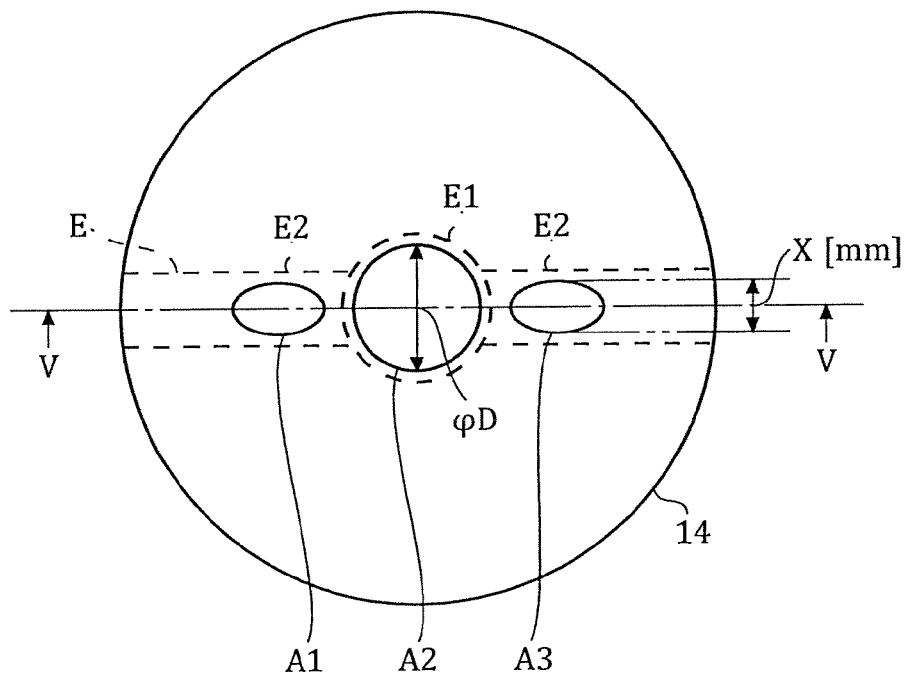
FIG. 4 schematically shows an EUV collector mirror according to the first embodiment of this disclosure, viewed from a plasma generation region.
Figure 5:
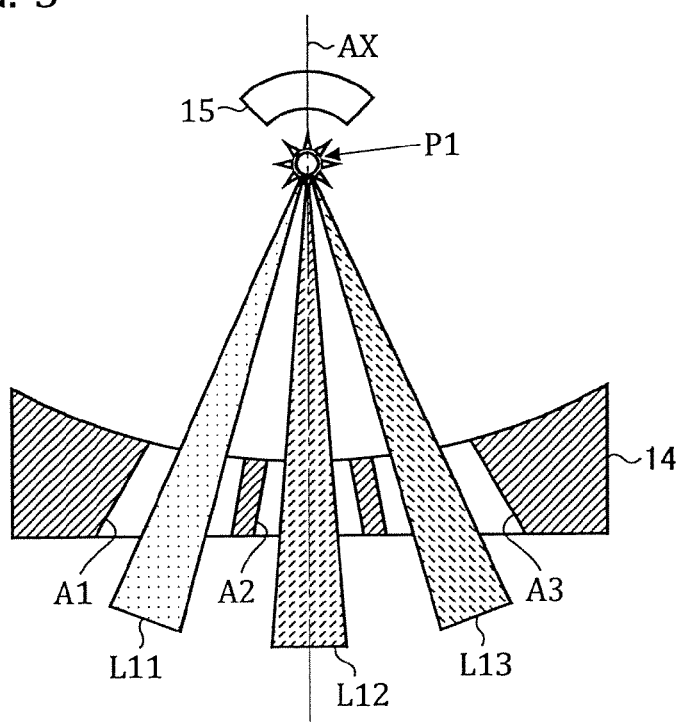
FIG. 5 is a schematic sectional view of the EUV collector mirror shown in FIG. 4, taken along plane V-V containing the axis of the EUV light and extending parallel to the longitudinal direction of an obscuration region included in the far field pattern of the EUV light.

FIG. 4 schematically shows the EUV collector mirror 14 according to the first embodiment, viewed from the plasma generation region P1. FIG. 5 is a schematic sectional view of the EUV collector mirror 14 shown in FIG. 4, taken along plane V-V containing the axis of the EUV light L2 and extending parallel to the longitudinal direction of the obscuration region E included in the far field pattern of the EUV light L2.

As shown in FIGS. 4 and 5, the obscuration region E may include a circular region (center region E1) at a position thereof corresponding substantially to the center of the reflective surface of the EUV collector mirror 14, and belt-like regions (belt regions E2) extending from the center region E1 toward the edge of the EUV collector mirror 14. Hence, the EUV collector mirror 14 according to the first embodiment may be provided with the through-hole A2 allowing the passage of the main pulsed laser beam L12 in a portion thereof corresponding to the center region E1. The through-hole A2 has a diameter $\phi D$ smaller than the diameter of the center region E1 of the obscuration region E. The through-hole A1 allowing the passage of the pre-pulsed laser beam L11 and the through-hole A3 allowing the passage of the ionization laser beam L13 may be provided in regions of the EUV collector mirror 14 corresponding to the belt regions E2. The through-holes A1 and A3 may have a width X in the width direction of the belt regions E2 smaller than the width of the belt regions E2. Therefore, the laser beams (L11 and L12) for turning the droplet D into plasma may travel toward the plasma generation region P1 from the back side of the EUV collector mirror 14 and be focused in the plasma generation region P1, while the exposure process performed in the exposure apparatus is not affected.

According to the first embodiment employing such configuration, different laser beams (the pre-pulsed laser beam L11 and the main pulsed laser beam L12) may be applied to the droplet D from the back side of the EUV collector mirror 14, even in a case where the target material is to be turned into plasma through a plurality of steps of laser beam irradiation. Consequently, the droplet D may be turned into plasma, from which the EUV light L2 is emitted, with higher intensity, toward the EUV collector mirror 14 with respect to the plasma generation region P1. When the axis of the pre-pulsed laser beam L11 is made to coincide, as much as possible, with the axis of the main pulsed laser beam L12, the target material may be turned into plasma more efficiently.

In the first embodiment, the ionization laser beam L13 for ionizing the neutral debris may be applied to the target material (debris) from the same side as the laser beams for plasma generation. With this, the ionization laser beam L13 may effectively be applied to neutral particles of the debris. Such efficient ionization of the debris may enable the collection of resulting ions by trapping them into the magnetic field.

First Modification

Figure 6:
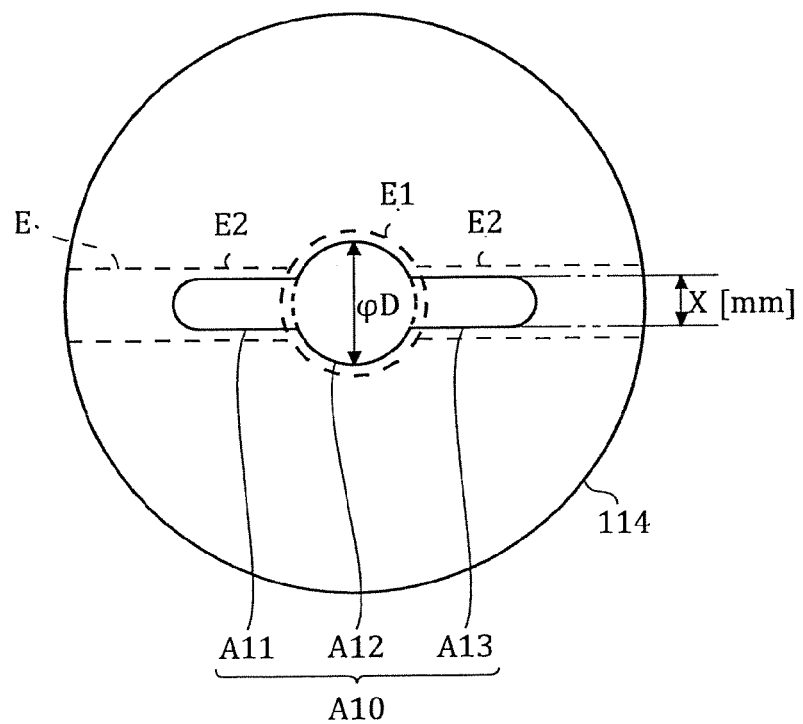
FIG. 6 schematically shows an EUV collector mirror according to a first modification of the first embodiment of this disclosure, viewed from the plasma generation region.

In the first embodiment described above, the through-holes A1 through A3 have been provided individually for the respective laser beams L11 through L13 traveling through the EUV collector mirror 14. This disclosure, however, is not limited thereto. Hereinafter, modifications of the EUV collector mirror 14 according to the first embodiment will be described in detail with reference to the relevant drawings. FIG. 6 schematically shows an EUV collector mirror 114 according to a first modification of the first embodiment, viewed from the plasma generation region P1.

An EUV collector mirror 114 according to the first modification shown in FIG. 6 may be configured similarly to the EUV collector mirror 14 shown in FIGS. 4 and 5, except in that a through-hole (second through-hole or wing portion) A11 for the pre-pulsed laser beam L11 and a through-hole (second through-hole or wing portion) A13 for the ionization laser beam L13 may have wing-like shapes extending from a through-hole (first through-hole or center region) A12 for the main pulsed laser beam L12. By providing a single through-hole A10 for the plurality of the laser beams L11 through L13, the EUV collector mirror 114 can be processed more easily. The through-hole A10 may be provided within the portion of the EUV collector mirror 114 corresponding to the obscuration region E, as in the through-holes A1 through A3 according to the first embodiment.

Second Modification

Figure 7:
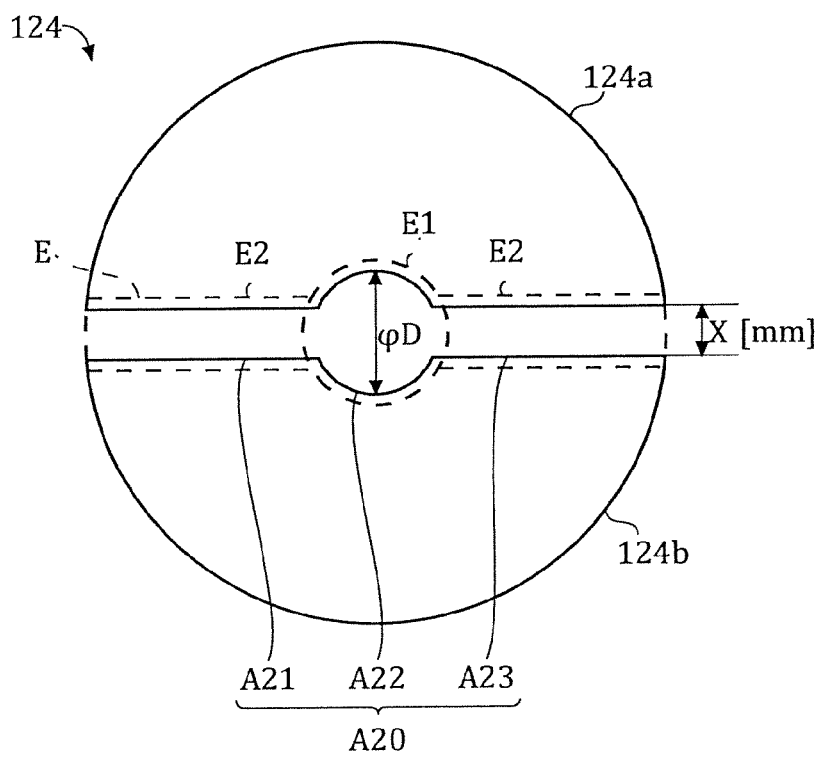
FIG. 7 schematically shows an EUV collector mirror according to a second modification of the first embodiment of this disclosure, viewed from the plasma generation region.

An EUV collector mirror according to a second modification of the first embodiment will now be described in detail with reference to the relevant drawings. FIG. 7 schematically shows an EUV collector mirror 124 according to the second modification of the first embodiment, viewed from the plasma generation region P1.

As shown in FIG. 7, the EUV collector mirror 124 according to the second modification may include two semicircular mirror members 124a and 124b. In the second modification, the two mirror members 124a and 124b may be assembled with a space provided therebetween. Thus, a space A20 including a circular space A22 for the main pulsed laser beam L12 and belt-like spaces A21 and A23 for the pre-pulsed laser beam L11 and the ionization laser beam L13, respectively, extending from the circular space A22 may be provided in a portion of the EUV collector mirror 124 corresponding to the obscuration region E. By providing the EUV collector mirror 124 configured of the plurality of the separate mirror members assembled with a space therebetween allowing the passage of the laser beams, the EUV collector mirror 124 can be processed more easily.

Third Modification

Figure 8:
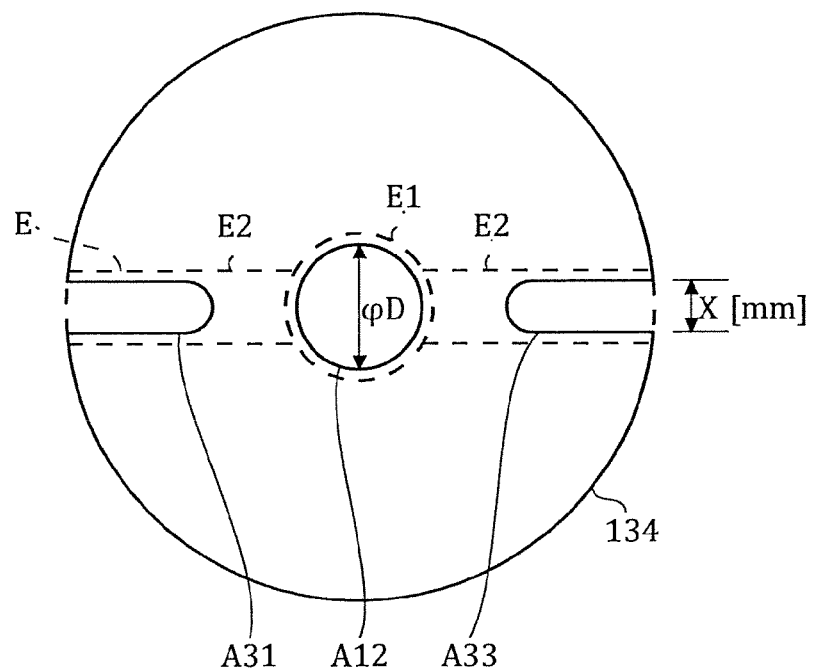
FIG. 8 schematically shows an EUV collector mirror according to a third modification of the first embodiment of this disclosure, viewed from the plasma generation region.

An EUV collector mirror according to a third modification of the first embodiment will now be described in detail with reference to the relevant drawings. FIG. 8 schematically shows an EUV collector mirror 134 according to the third modification of the first embodiment, viewed from the plasma generation region P1.

As shown in FIG. 8, the EUV collector mirror 134 according to the third modification may be similarly to the EUV collector mirror 14 shown in FIGS. 4 and 5, except in that notches A31 and A33 provided by making cuts from the outer periphery of the EUV collector mirror 134 may function as the through-hole A1 for the pre-pulsed laser beam L11 and the through-hole A3 for the ionization laser beam L13, respectively. By providing the through-holes for the laser beams, in portions of the EUV collector mirror 134 corresponding to the belt regions E2 of the obscuration region E, in the form of the notches A31 and A33 provided by making cuts from the outer periphery of the EUV collector mirror 134, the EUV collector mirror 134 may be processed more easily. A through-hole A12 may be similar to the through-hole A2 according to the first embodiment. The notches A31 and A33 may be provided within a portion of the EUV collector mirror 134 corresponding to the obscuration region E.

Fourth Modification

Figure 9:
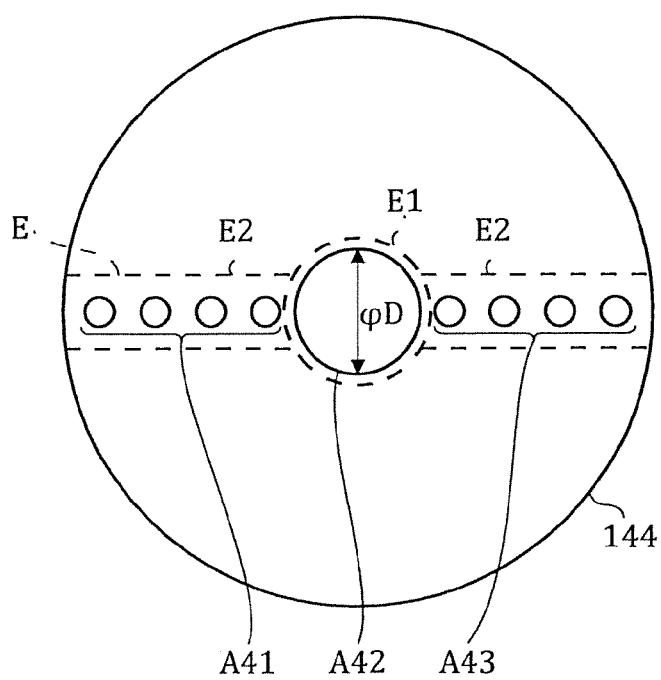
FIG. 9 schematically shows an EUV collector mirror according to a fourth modification of the first embodiment of this disclosure, viewed from the plasma generation region.

FIG. 9 schematically shows an EUV collector mirror 144 according to a fourth modification of the first embodiment, viewed from the plasma generation region P1. In the first embodiment and the modifications thereof described so far, the EUV collector mirror has been provided with two through-holes for the laser beams beside the laser beam passing through the through-hole in the center region. This disclosure, however, is not limited thereto and can be modified in various other ways. For example, referring to FIG. 9, two or more (four in the fourth modification) through-holes A41 or A43 may be provided on each side of a through-hole A42 in the center. Thus, more elements such as measuring devices can be provided on the side toward which the EUV light L2 may be emitted more intensely and which is closer to the plasma generation region P1. The through-holes provided in the portions of the EUV collector mirror corresponding to the belt regions E2 may not necessarily be aligned linearly.

Fifth Modification

Figure 10:
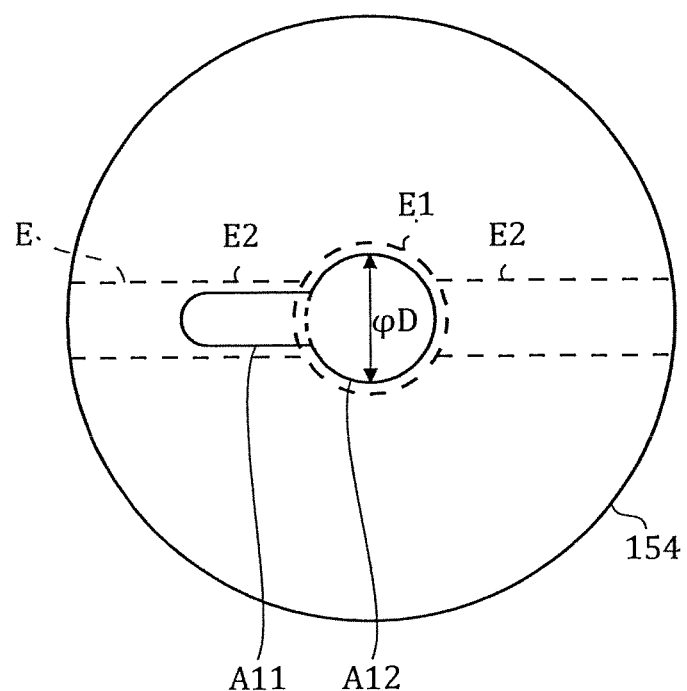
FIG. 10 schematically shows an EUV collector mirror according to a fifth modification of the first embodiment of this disclosure, viewed from the plasma generation region.

FIG. 10 schematically shows an EUV collector mirror 154 according to a fifth modification of the first embodiment, viewed from the plasma generation region P1. In the first embodiment and the modifications thereof described so far, through-holes, such as the through-holes, the notches, or the spaces, allowing the passage of the laser beams have been arranged in point symmetry or in line symmetry with respect to the center of the EUV collector mirror. This disclosure, however, is not limited thereto. For example, as in the EUV collector mirror 154 shown in FIG. 10, only a through-hole A11 may be provided in one of the portions of the EUV collector mirror corresponding to the belt regions E2. Alternatively, the through-holes provided in the portions of the EUV collector mirror corresponding to the two respective belt regions E2 may differ in pattern from each other, and each may be any of the through-holes, the spaces, the notches, and so forth.

Sixth Modification

Figure 11:
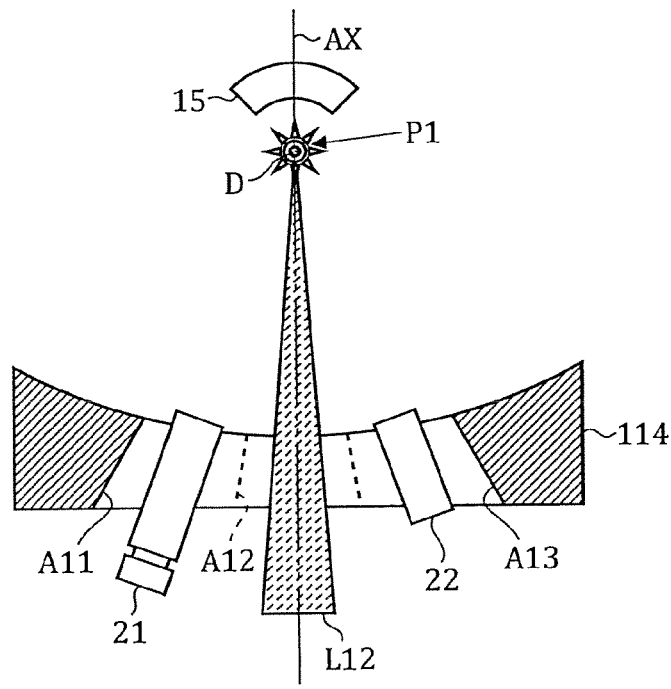
FIG. 11 schematically shows an exemplary usage of an EUV collector mirror according to a sixth modification of the first embodiment of this disclosure.

In the first embodiment and the modifications thereof described so far, the through-holes in the EUV collector mirror have been provided for allowing the laser beams to pass therethrough and to be focused in the plasma generation region P1. This disclosure, however, is not limited thereto, as described above. Hereinafter, exemplary usages of the through-holes in the EUV collector mirror will be described in detail as modifications of the first embodiment with reference to the relevant drawings. FIG. 11 schematically shows an exemplary usage of the EUV collector mirror according to a sixth modification of the first embodiment. In the sixth modification and other modifications given below, the EUV collector mirror 114 according to the first modification will be adopted as an example.

Referring to FIG. 11, it is possible to dispose, in the through-holes A11 through A13 provided in the portions of the EUV collector mirror 114 corresponding, for example, to the belt regions E2 in the obscuration region E, measuring devices such as a plasma monitor camera 21 for monitoring the position where the EUV light L2 is emitted (the position of plasma generation), an EUV light energy monitor 22 for detecting the energy of the emitted EUV light L2. Such measuring devices to be provided in the through-holes A11 through A13 may be oriented, for example, toward the plasma generation region P1. Specifically, in the sixth modification, the configuration is such that the axis of the detection range of the plasma monitor camera 21, the axis of the detection range of the EUV light energy monitor 22, or the like, in addition to the axes of the laser beams pass through the through-holes A11 through A13. Thus, the plasma and the EUV light L2 generated in the plasma generation region P1 may be monitored at positions closer to the plasma generation region P1 and on the side toward which the EUV light L2 may be emitted more intensely. Consequently, the detection accuracy of the measuring devices may be improved. For example, when the position of plasma generation is detected, the amount of deviation in the position of the plasma generation may be calculated, and the position of a laser-focusing optical system may be adjusted. Thus, the position of the plasma generation may be controlled accordingly. The measuring devices provided in the through-holes A11 through A13 may be oriented parallel to the axis of the EUV light L2.

In the example shown in FIG. 11, the plasma monitor camera 21 and the EUV light energy monitor 22 may be provided in the through-holes A11 through A13, in addition to the laser beam paths along which the laser beams travel toward the plasma generation region P1 from the back side of the EUV collector mirror 114. This disclosure, however, is not limited thereto. For example, the position where the EUV light L2 is emitted (the position of plasma generation) and the energy of the emitted EUV light L2 may be detected from the back side of the EUV collector mirror 114 through any of the through-holes A11 through A13. Moreover, the configuration may be such that the plasma monitor camera 21 and the EUV light energy monitor 22 may project from any of the through-holes A11 through A13 toward the plasma generation region P1, whereby the position where the EUV light L2 is emitted (the position of plasma generation) and the energy of the emitted EUV light L2 can be detected at positions closer to the plasma generation region P1.

Seventh Modification

Figure 12:
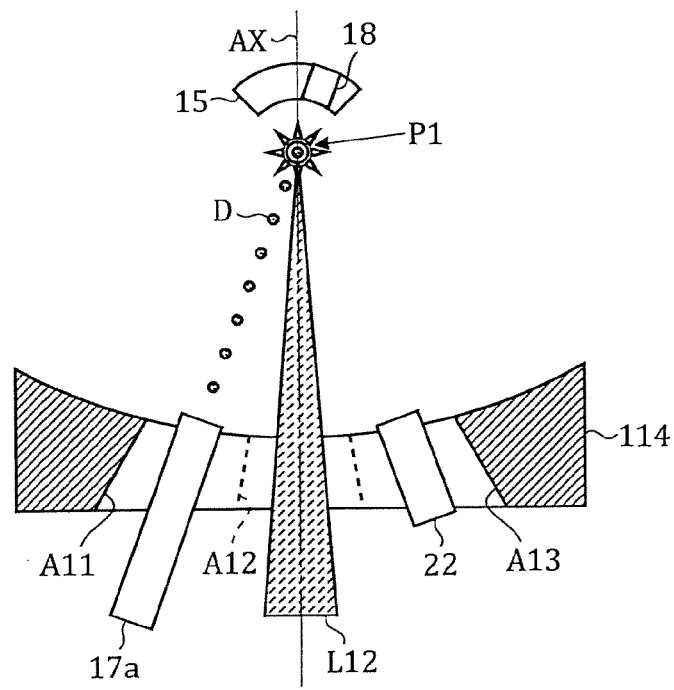
FIG. 12 schematically shows an exemplary usage of an EUV collector mirror according to a seventh modification of the first embodiment of this disclosure.

FIG. 12 schematically shows an exemplary usage of an EUV collector mirror according to a seventh modification of the first embodiment.

As shown in FIG. 12, the nozzle 17a serving as an output port of the droplets D may be disposed in any of the through-holes A11 through A13 in the EUV collector mirror 114. The output axis of the nozzle 17a may be oriented toward the plasma generation region P1. With this, the droplets D may be outputted toward the plasma generation region P1 from a position closer to the plasma generation region P1. Consequently, the droplets D may be supplied to a predetermined position with higher precision and at more precise timing. The nozzle 17a may project from the EUV collector mirror 114 toward the plasma generation region P1. In such a case, the tip of the nozzle 17a may be positioned much closer to the plasma generation region P1. Consequently, the droplets D can be supplied to the predetermined position with higher accuracy and at more precise timing. The nozzle 17a and the droplet generator 17 may be connected to each other through, for example, a tube provided at the back side of the EUV collector mirror 114.

When the nozzle 17a is provided in any of the through-holes A11 through A13 in the EUV collector mirror 114, the target collection unit 18 for collecting the target material having passed through the plasma generation region P1 may be provided on the extension of a virtual line connecting the tip of the nozzle 17a and the plasma generation region P1. In the seventh modification, the target collection unit 18 may be provided in the beam dump 15, for example. With this, the target collection unit 18 may be disposed within the obscuration region E. The target collection unit 18 may be provided in the beam dump 15 by forming a cylindrical depression functioning as the target collection unit 18 on a portion of the beam dump 15.

Eighth Modification

Figure 13:
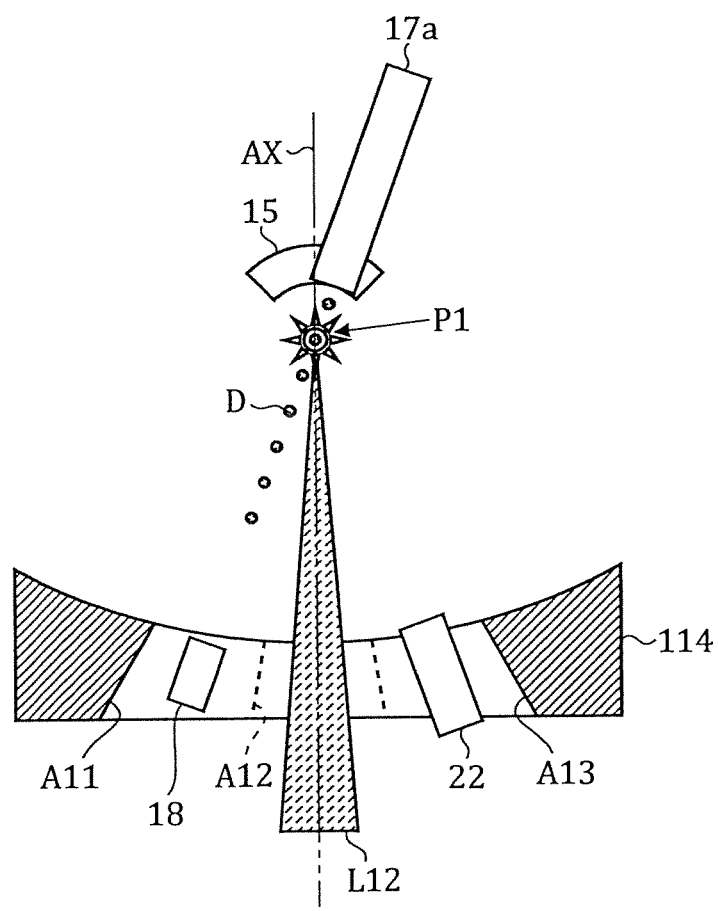
FIG. 13 schematically shows an exemplary usage of an EUV collector mirror according to an eighth modification of the first embodiment of this disclosure.

FIG. 13 schematically shows an exemplary usage of the EUV collector mirror according to an eighth modification of the first embodiment. In the seventh modification described above, the nozzle 17a has been provided in the through-hole A11 in the EUV collector mirror 114, and the target collection unit 18 has been provided in the beam dump 15. This disclosure, however, is not limited thereto. For example, as shown in FIG. 13, the nozzle 17a may be provided in the beam dump 15, and the target collection unit 18 may be provided in the through-hole A11 in the EUV collector mirror 114. In such a case, the configuration may be such that the extension of the axis of the opening in the target collection unit 18 may pass through the plasma generation region P1.

Ninth Modification

Figure 14:
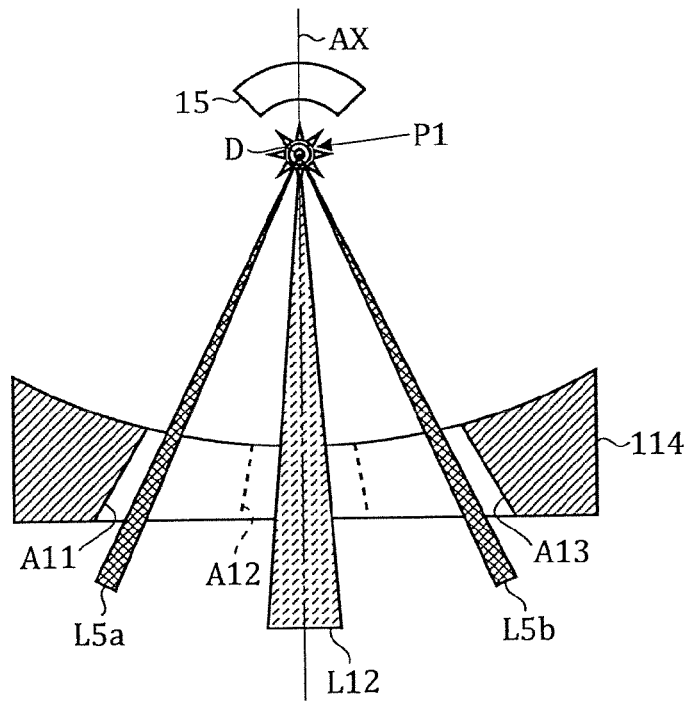
FIG. 14 schematically shows an exemplary usage of an EUV collector mirror according to a ninth modification of the first embodiment of this disclosure.

FIG. 14 schematically shows an exemplary usage of the EUV collector mirror according to a ninth modification of the first embodiment. As shown in FIG. 14, the through-holes A11 through A13 in the EUV collector mirror 114 may be used as through-holes through which position-detecting guide laser beams L5 (L5a and L5b) for detecting the position and the timing of the passage of the droplet D may travel toward the plasma generation region P1 from the back side of the EUV collector mirror 114. The position-detecting guide laser beams L5a and L5b are preferably applied to the plasma generation region P1 in two directions with an axis AX of the EUV light L2 being located therebetween. The position-detecting guide laser beams L5 may be pulsed laser beams for timing synchronization. In such a case, the axes of the two position-detecting guide laser beams L5 are preferably angled by 90 degrees with respect to each other. With this, the position and the timing of the passage of the droplet D may be detected more precisely. Consequently, the output of the droplet D may be controlled so that the droplet D may pass through a predetermined position with higher precision and at more precise timing.

Tenth Modification

Figure 15:
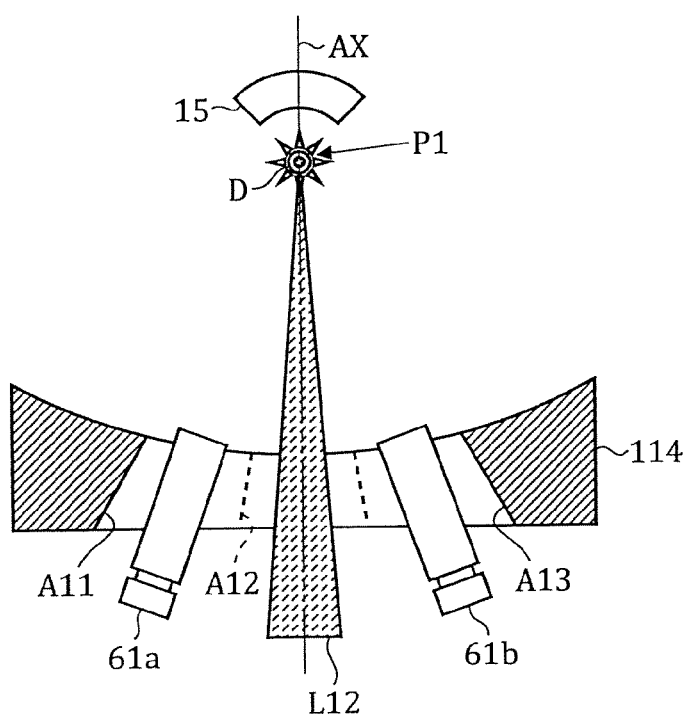
FIG. 15 schematically shows an exemplary usage of an EUV collector mirror according to a tenth modification of the first embodiment of this disclosure.

FIG. 15 schematically shows an exemplary usage of the EUV collector mirror according to a tenth modification of the first embodiment. In the ninth modification described above, the position-detecting guide laser beams L5 have been applied to the plasma generation region P1, and the laser beam reflected thereat has been observed to detect the position and the timing of the passage of the droplet D. This disclosure, however, is not limited thereto. For example, as shown in FIG. 15, the position and the timing of the passage of the droplet D may be detected based on an image captured by target-position-measuring cameras 61a and 61b imaging the plasma generation region P1. In such a case, as in the ninth modification, the two target-position-measuring cameras 61 may preferably be positioned with the axis AX of the EUV light L2 located therebetween so that images of the plasma generation region P1 may be captured in two directions. Furthermore, the axes of observation by the target-position-measuring cameras 61 may preferably be angled by 90 degrees with respect to each other. Thus, the position and the timing of the passage of the droplet D may be detected more precisely. Consequently, the output of the droplet D may be controlled so that the droplet D may pass through a predetermined position with higher precision and at more precise timing.

Eleventh Modification

Figure 16:
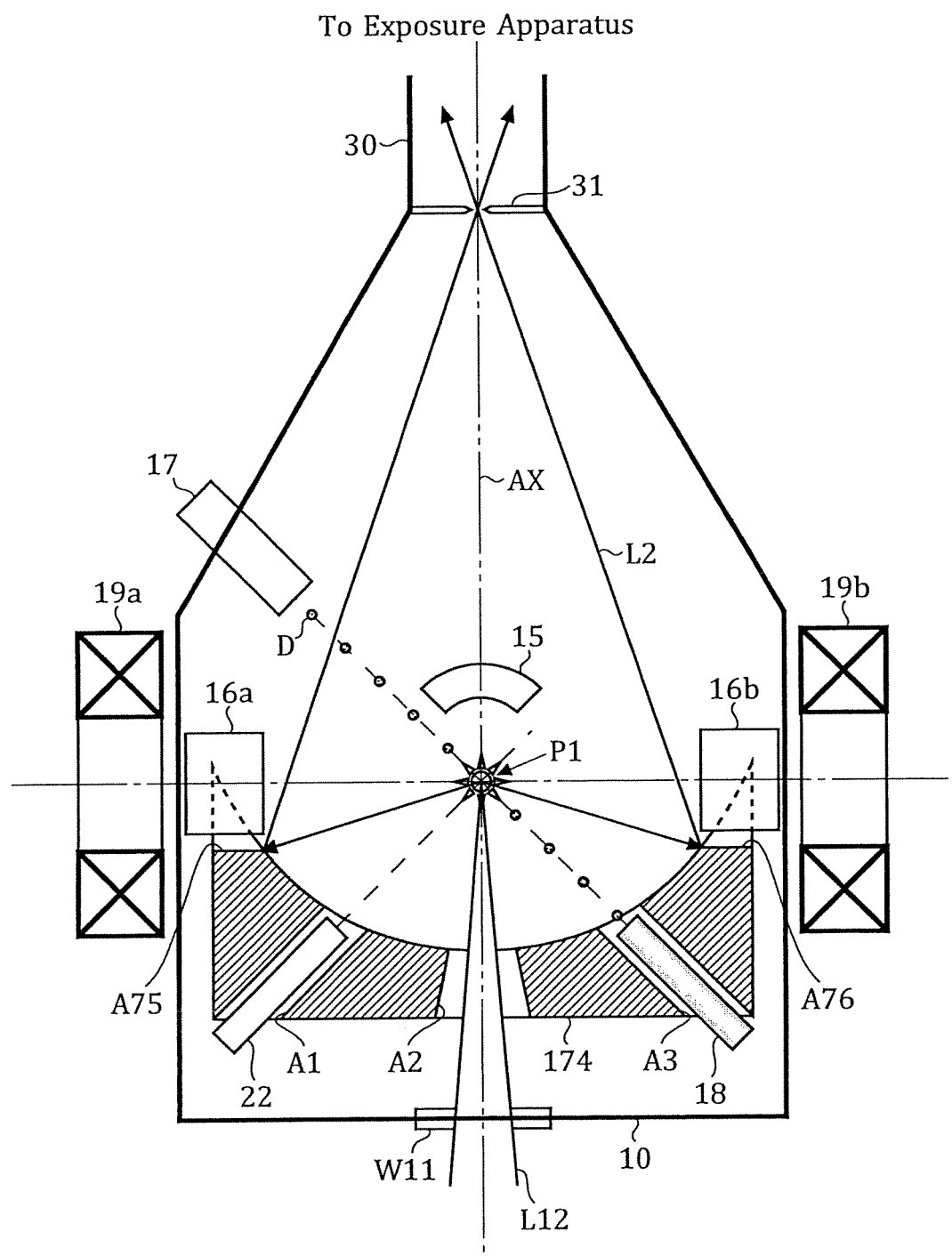
FIG. 16 is a schematic sectional view of an EUV light generation system according to an eleventh modification of the first embodiment of this disclosure, taken along a plane containing the axis of the EUV light.
Figure 17:
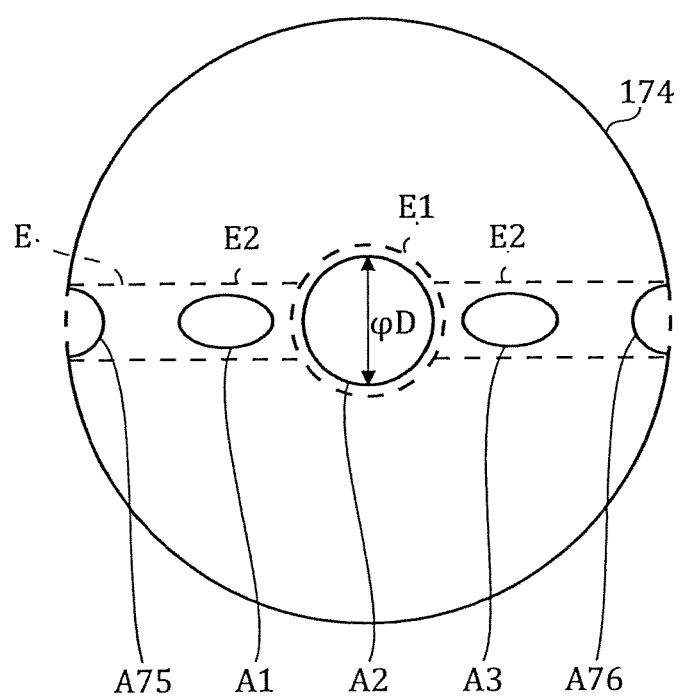
FIG. 17 schematically shows an EUV collector mirror according to the eleventh modification of the first embodiment of this disclosure, viewed from the plasma generation region.

FIG. 16 is a schematic sectional view of an EUV light generation system according to an eleventh modification of the first embodiment, taken along a plane containing the axis of the EUV light. FIG. 17 schematically shows an EUV collector mirror 174 according to the eleventh modification of the first embodiment, viewed from the plasma generation region P1.

For example, to collect more EUV light L2 emitted in the plasma generation region P1, the EUV collector mirror may need to be positioned closer to the plasma generation region P1. However, when the debris collection units 16a and 16b are provided in the chamber 10 so as to extend into the obscuration region E, peripheral portions of the reflective surface of the EUV collector mirror may come into contact with the debris collection units 16a and 16b. This may limit the extent to which the EUV collector mirror may be disposed close to the plasma generation region P1. Accordingly, the EUV collector mirror 174 shown in FIGS. 16 and 17 may be provided with U-shaped notches A75 and A76 at the periphery of the reflective surface thereof. The debris collection units 16a and 16b may be accommodated inside the respective notches A75 and A76. With this, the EUV collector mirror 174 can be positioned closer to the plasma generation region P1. The notches A75 and A76 may be provided in portions of the EUV collector mirror 174 corresponding to the respective belt regions E2 of the obscuration region E.

According to the first embodiment and the modifications thereof described above, various elements can be positioned relatively freely with respect to the plasma generation region P1, even on the side toward which the EUV light may be emitted more intensely, that is, the side where the EUV collector mirror may be provided with respect to the plasma generation region P1.

Second Embodiment

An EUV collector mirror and an EUV light generation system according to a second embodiment of this disclosure will now be described in detail with reference to the relevant drawings. In the following description, elements similar to those in the first embodiment and the modifications thereof described above will be denoted by the same reference numerals as those in the first embodiment and the modifications thereof, and duplicate descriptions of thereof will thus be omitted.

Figure 18:
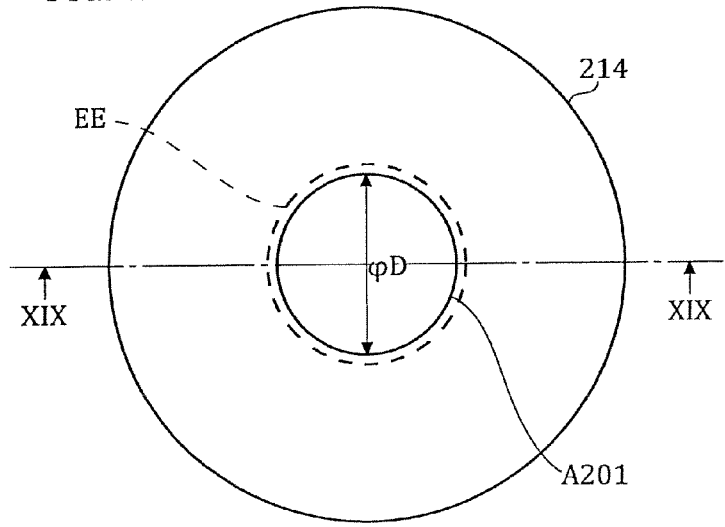
FIG. 18 schematically shows an EUV collector mirror according to a second embodiment of this disclosure, viewed from the plasma generation region.
Figure 19:
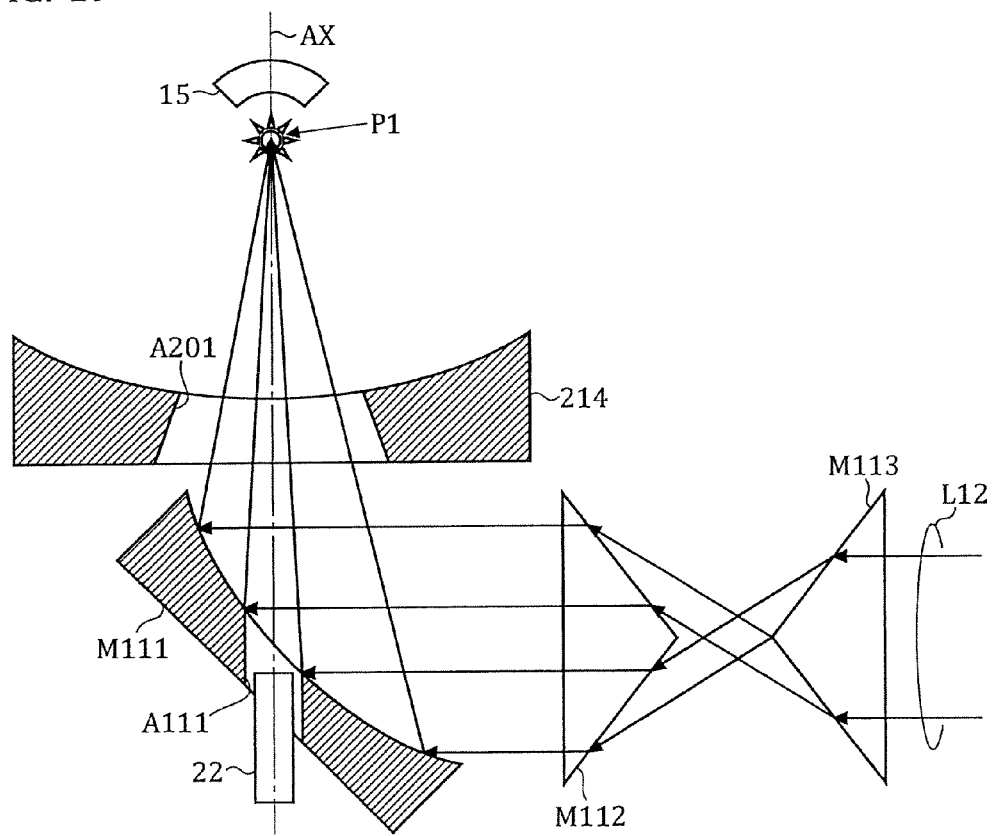
FIG. 19 is a schematic sectional view of the EUV collector mirror shown in FIG. 18, taken along plane XIX-XIX containing the axis of the EVU light.

FIG. 18 schematically shows an EUV collector mirror 214 according to the second embodiment, viewed from the plasma generation region P1. FIG. 19 is a schematic sectional view of the EUV collector mirror 214 shown in FIG. 18, taken along plane XIX-XIX containing the axis of the EVU light.

In a case where an obscuration region EE has a conical shape, that is, in a case where a portion of the reflective surface of the EUV collector mirror 214 corresponding to the obscuration region EE has a circular shape, a through-hole A201 which may not affect the exposure process performed in the exposure apparatus can only be provided in the circular portion of the EUV collector mirror 214 corresponding to the obscuration region EE, as shown in FIG. 18. Hence, in the second embodiment as shown in FIG. 19, optical elements (in the second embodiment, conical lenses M112 and M113 and an off-axis paraboloidal mirror M111) for shaping the cross section of a laser beam (for example, the main pulsed laser beam L12) to be focused in the plasma generation region P1 through the EUV collector mirror 214 may be provided to the back side of the EUV collector mirror 214 with respect to the plasma generation region P1 and inside or outside the chamber 10 (not shown). The conical lens M113 may be disposed such that the main pulsed laser beam L12 is incident on the base thereof. Thus, the main pulsed laser beam L12 outputted from the conical lens M113 has an annular cross section. The conical lens M112 may be disposed such that the apex thereof faces the apex of the conical lens M113. Thus, the main pulsed laser beam L12 having an annular cross section is incident on the sloped surface of the conical lens M112 and is outputted from the base of the conical lens M112, thereby being collimated into a beam having an annular cross section.

The main pulsed laser beam L12 having been transformed into a collimated laser beam as described above may then be incident on the off-axis paraboloidal mirror M111. The off-axis paraboloidal mirror M111 may be disposed such that the main pulsed laser beam L12 incident thereon is focused in the plasma generation region P1 through the through-hole A201 in the EUV collector mirror 214. The off-axis paraboloidal mirror M111 may have, in the center thereof, a through-hole A111 extending along a virtual line connecting the center of the reflective surface thereof and the plasma generation region P1. The end of the through-hole A111 on the side of the reflective surface may be contained within the hollow center region of the main pulsed laser beam L12. With this, the main pulsed laser beam L12 may be focused in the plasma generation region P1 with little energy loss.

The EUV light energy monitor 22, for example, may be provided in the through-hole A111 in the off-axis paraboloidal mirror M111. With this, the energy of the EUV light L2 can be monitored at the side toward which the EUV light L2 is emitted more intensely. Consequently, the EUV energy proportional to EUV energy, at a second position, of the EUV light L2 collected by the EUV collector mirror 214 can be detected. This disclosure, however, is not limited thereto. Any of the plasma monitor camera 21, the nozzle 17a, the target collection unit 18, the axes of the position-detecting guide laser beams L5, the target-position-measuring cameras 61, and so forth may be provided in the through-hole A111.

In the examples shown in FIGS. 1 and 16, windows have been provided for introducing the laser beams therethrough into the chamber. This disclosure, however, is not limited thereto. For example, the chamber 10 may be connected to an output window of a $CO_2$ laser apparatus through an airtight optical tube, the interior of the chamber 10 and the tube being maintained at a pressure at which EUV light can be transmitted thereinside. In such a case, the optical tube may serve as the laser beam introduction passage. When the maintenance work is to be carried out on the chamber 10, two gate valves may be provided at each joint, and the gate valves may be closed as the chamber 10 is to be removed therefrom.

According to the second embodiment configured as above, as in the first embodiment and the modifications thereof, various elements can be positioned relatively freely with respect to the plasma generation region P1 on the side toward which the EUV light may be emitted more intensely, that is, the side where the EUV collector mirror may be provided with respect to the plasma generation region P1. The other configurations and the effects are similar to those described in the first embodiment and the modifications thereof; thus, duplicate descriptions thereof will be omitted here.

Third Embodiment

In the first and second embodiments, the EUV collector mirrors 14, 114, 124, 134, 144, 154, 174, and 214 have been secured to the chamber 10 thereinside. A third embodiment of this disclosure concerns an exemplary scheme of securing the EUV collector mirror to the chamber 10. While the following description recites the first embodiment (FIG. 1), this disclosure is not limited thereto.

Figure 20:
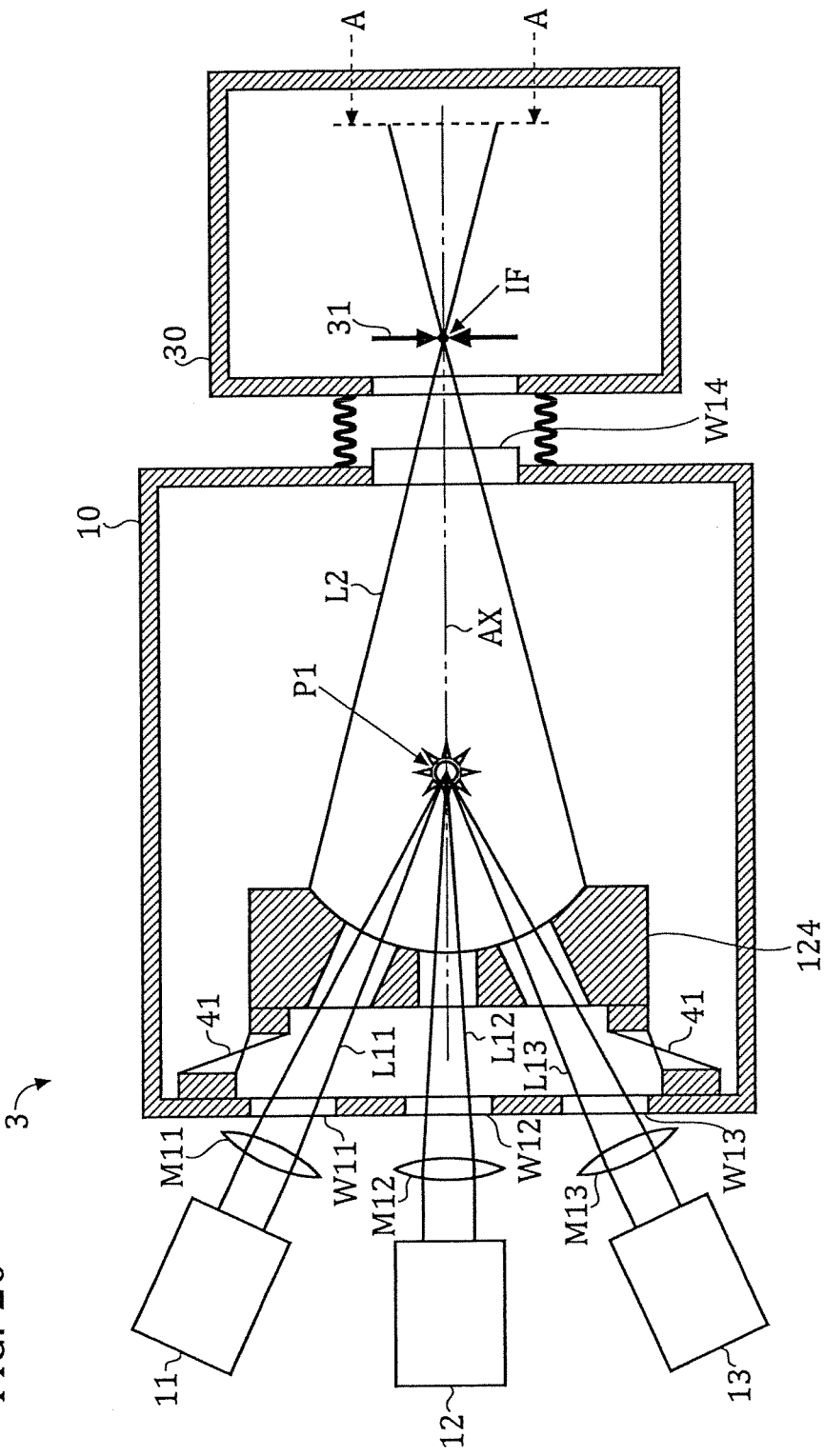
FIG. 20 is a schematic sectional view of an EUV light generation system according to a third embodiment of this disclosure, taken along a plane containing the axis of the EUV light.
Figure 21:
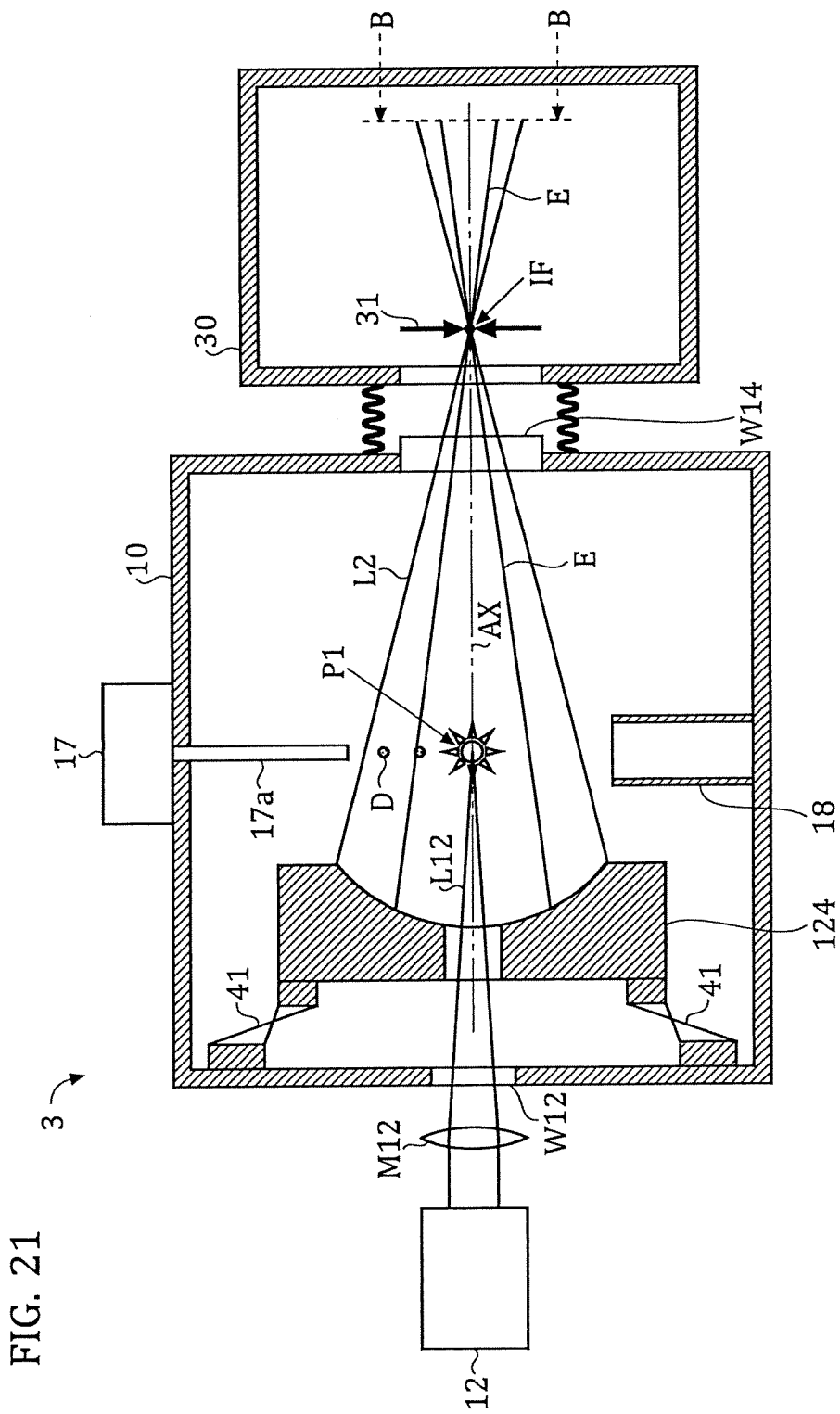
FIG. 21 is a schematic sectional view of the EUV light generation system shown in FIG. 20, taken along another plane containing the axis of the EUV light, the plane being different from that for FIG. 20.

FIG. 20 is a schematic sectional view of an EUV light generation system 3 according to the third embodiment, taken along a plane containing the axis of the EUV light. FIG. 21 is a schematic sectional view of the EUV light generation system 3 shown in FIG. 20, taken along another plane containing the axis of the EUV light, the place being different from that for FIG. 20. While the electromagnetic coils 19a and 19b, the debris collection units 16a and 16b, and the beam dump 15 shown in FIGS. 1 and 2 are not shown in FIGS. 20 and 21, these elements may also be provided.

Figure 22:
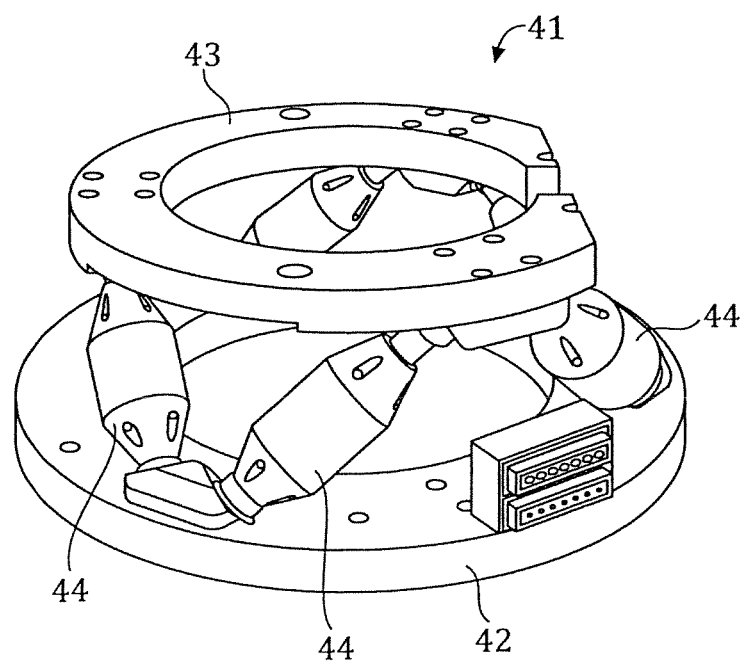
FIG. 22 is a schematic perspective view of a five-axis stage movable along five axes of horizontal (X and Y), vertical (Z), tilting (T), and rotational (R) movements.

Referring to FIGS. 20 and 21, the EUV light generation system 3 according to the third embodiment may further include a stage 41 on which the EUV collector mirror 124 is disposed. The mounting surface of the stage 41 may be either fixed or movable relative to the surface to which the stage 41 is secured. The third embodiment concerns the stage 41 shown in FIG. 22, of which the mounting surface is movable. FIG. 22 is a schematic perspective view of the stage 41, which is a five-axis stage, of which the mounting surface is movable along five axes of horizontal (X and Y), vertical (Z), tilting (T), and rotational (R) movements.

As shown in FIG. 22, the stage 41 may include two annular plates 42 and 43 and, for example, six actuators 44. The plate 43 may be supported by the six actuators 44 with respect to the plate 42. Thus, driving the actuators 44 appropriately allows the plate 43 to be moved horizontally and vertically, to be tilted, and to be rotated relative to the plate 42.

Figure 23:
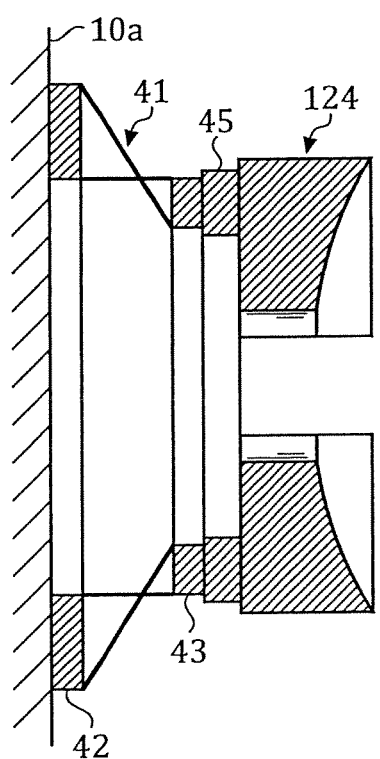
FIG. 23 is a schematic sectional view of the stage with the EUV collector mirror shown in FIG. 7 mounted thereon, taken along a plane containing the axis of the EUV light reflected thereby.

FIG. 23 is a schematic sectional view of the stage 41 with the EUV collector mirror 124 mounted thereon, taken along a plane containing the axis of the reflected EUV light. As shown in FIG. 23, the plate 42 of the stage 41 is secured, for example, to an inner wall surface 10a of the chamber 10, and the EUV collector mirror 124 is secured to the plate 43. Accordingly, moving the plate 43 relative to the plate 42 allows the EUV collector mirror 124 to be moved. In a case where the mirror includes a plurality of separate members as in the case of the EUV collector mirror 124, a mirror-connecting plate 45 for connecting the separate members may be provided. In such a case, the EUV collector mirror 124 may be assembled using the mirror-connecting plate 45, and thereafter the EUV collector mirror 124 and the mirror-connecting plate 45 may together be mounted on the plate 43. This approach may facilitate the mounting of the EUV collector mirror 124.

The pre-pulsed laser beam L11, the main pulsed laser beam L12, and the ionization laser beam L13, which may travel through the through-holes A1 through A3 respectively from the back side of the EUV collector mirror 124 and be focused in the plasma generation region P1, may pass through the through-holes provided in the centers of the annular plates 42 and 43.

As described above, according to the first through third embodiments of this disclosure, various elements can be provided in the plurality of through-holes in the EUV collector mirror. Hence, an EUV collector mirror and an EUV light generation system with enhanced flexibility in the arrangement of such elements with respect to the plasma generation region can be obtained.

The above-described embodiments and the modifications thereof are merely exemplary embodiments and modifications of this disclosure. This disclosure is not limited to these embodiments and modifications, and can be variously modified according to the specifications or the like. Further, it is obvious from the above description that other various embodiments can be made within the scope of the disclosure. In addition, the above embodiments and modifications can be combined as desired.

The invention claimed is:

1. A chamber apparatus which has an obscuration region and is used with an external apparatus, the chamber apparatus comprising:
    a chamber in which extreme ultraviolet light is generated;
    a collector mirror configured for reflecting and collecting an extreme ultraviolet light generated in the chamber, the collector mirror having a through-hole and two notches, the through-hole being located at a center of a reflecting surface of the collector mirror and penetrating the collector mirror from a reflective side of the collector mirror to a back side of the collector mirror, each of the two notches being a cut in an edge of the collector mirror, the two notches being symmetrically-located with respect to the center of the reflection surface of the collector mirror;
    a support configured for supporting the collector mirror in the chamber; and
    an output port provided to the chamber for allowing the extreme ultraviolet light reflected and collected by the collector mirror to be introduced therethrough into the external apparatus, wherein
    the support supports the collector mirror so that the two notches of the collector mirror are located at positions corresponding to the obscuration region.

2. The chamber apparatus according to claim 1, wherein the chamber includes at least one inlet port through which a laser beam is introduced into the chamber from outside and a focusing optical system configured for focusing the laser beam, and
    the laser beam travels through the at least one through-hole in the collector mirror and is focused in a predetermined region inside the chamber.

3. The chamber apparatus according to claim 1, wherein the chamber includes a target supply unit configured for supplying a target material into the chamber, and the target material is supplied to a predetermined region inside the chamber through one of the two notches in the collector mirror.

4. The chamber apparatus according to claim 1 wherein the chamber includes a target supply unit configured for supplying a target material into the chamber and a target-collecting unit configured for collecting at least part of the target material supplied into the chamber, and
    the target-collecting unit is positioned in one of the two notches in the collector mirror.

5. The chamber apparatus according to claim 1, wherein the chamber includes at least one measuring device, and
    the measuring device is positioned in one of the two notches.

6. The chamber apparatus according to claim 5, wherein the at least one measuring device is a plasma monitor camera.

7. The chamber apparatus according to claim 5, wherein the at least one measuring device is an extreme ultraviolet light energy monitor.

8. The chamber apparatus according to claim 5, wherein the at least one measuring device is a target-position-measuring camera.

9. The chamber apparatus according to claim 1, wherein the chamber includes a target supply unit configured for supplying a target material into the chamber and a debris-collecting unit configured for collecting debris from the target material supplied into the chamber, and
    the debris-collecting unit is positioned so in one of the two notches in the collector mirror.

10. An extreme ultraviolet light generation system which has an obscuration region and is used with an external laser apparatus, the system comprising:
    a chamber, in which extreme ultraviolet light is generated, including at least one inlet port through which a laser beam is introduced into the chamber from outside;
    a target supply unit configured for supplying a target material into the chamber;
    a focusing optical system configured for focusing the laser beam;
    a collector mirror configured for reflecting and collecting an extreme ultraviolet light generated in the chamber, the collector mirror having a through-hole and two notches, the through-hole being located at a center of a reflecting surface of the collector mirror and penetrating the collector mirror from a reflective side of the collector mirror to a back side of the collector mirror, each of the two notches being a cut in an edge of the collector mirror, the two notches being symmetrically-located with respect to the center of the reflection surface of the collector mirror;
    a support configured for supporting the collector mirror in the chamber; and
    an output port provided to the chamber for allowing the extreme ultraviolet light reflected and collected by the collector mirror to be introduced therethrough into the external apparatus, wherein
    the support supports the collector mirror so that the two notches of the collector mirror are located at positions corresponding to the obscuration region.

11. The system according to claim 10, wherein the laser beam travels through the through-hole in the collector mirror and is focused in a predetermined position inside the chamber.

12. The system according to claim 10, further comprising a target-collecting unit configured for collecting at least part of the target material supplied into the chamber, wherein the target-collecting unit is positioned in one of the two notches in the collector mirror.

13. The system according to claim 10, further comprising a debris-collecting unit configured for collecting debris from the target material supplied into the chamber, wherein
the debris-collecting unit is positioned in one of the two notches in the collector mirror.

14. The system according to claim 10, further comprising at least one measuring device positioned in one of the two notches in the collector mirror.

15. The system according to claim 14, wherein the at least one measuring device is a plasma monitor camera.

16. The system according to claim 14, wherein the at least one measuring device is an extreme ultraviolet light energy monitor.

17. The system according to claim 14, wherein the at least one measuring device is a target-position-measuring camera.

18. The chamber apparatus according to claim 1, wherein each of the notches has a substantively horseshoe shape when viewed from a side of the reflection surface and does not penetrate the collector mirror.

* * * * *